(12) United States Patent
Tao

(10) Patent No.: US 6,456,105 B1
(45) Date of Patent: Sep. 24, 2002

(54) METHOD FOR DETERMINING TRANSISTOR GATE OXIDE THICKNESS

(75) Inventor: Jiang Tao, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/634,133

(22) Filed: Aug. 8, 2000

(51) Int. Cl.[7] ............................................... G01R 31/26
(52) U.S. Cl. ........................ 324/769; 324/765; 438/16
(58) Field of Search ................................. 324/769, 765, 324/766, 767, 768; 438/16, 17, 18

(56) References Cited

U.S. PATENT DOCUMENTS

| | | | |
|---|---|---|---|
| 5,485,097 A | * | 1/1996 | Wang .......................... 324/765 |
| 5,757,204 A | * | 5/1998 | Nayak et al. ................ 324/769 |

OTHER PUBLICATIONS

Kevin J. Yang & Chenming Hu: "MOS Capacitance Measurements For High–Leakage Thin Dielectrics." IEEE Transactions On Electron Devices; vol. 46, No. 7, Jul. 1999; pp. 1500 & 1501.

* cited by examiner

Primary Examiner—N. Le
Assistant Examiner—James Kerveros
(74) Attorney, Agent, or Firm—LaRiviere, Grubman & Payne, LLP

(57) ABSTRACT

A method for determining the electrical thickness of a very thin gate oxide layer of a MOSFET that is subject to relatively high leakage current owing to its thinness includes measuring first and second frequency-dependent capacitances $C_1$, $C_2$ and then using the capacitances to render a corrected capacitance. The electrical thickness is then determined using not the measured capacitances, but rather the corrected capacitance, to render a comparatively more accurate value of gate oxide electrical thickness $T_{ox}$.

6 Claims, 4 Drawing Sheets

METHOD FOR DETERMINING TRANSISTOR GATE OXIDE THICKNESS

TECHNICAL FIELD

The present invention relates generally to semiconductor fabrication, and more particularly to methods for determining MOS transistor gate oxide thickness.

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate, and then forming a source region and a drain region side by side in the substrate beneath the gate by implanting appropriate dopant materials into the areas of the substrate that are to become the source and drain regions. The gate is insulated from the source and drain regions by a thin gate oxide layer that has a thickness of a few to several tens of Angstroms. This generally-described structure cooperates to function as a transistor.

It is important from the standpoint of process control that the electrical thickness of the gate oxide layer be precisely known. For instance, if a gate oxide layer is designed to be only 15 Å thick, deviations from the design thickness must be detected so that the process can be appropriately adjusted to avoid making MOS transistors that do not perform according to specification, and/or that perform unreliably.

The present invention recognizes that one way to measure the electrical thickness of a gate oxide layer is by measuring the gate capacitance as a function of gate voltage, and then using the capacitance at the desired gate voltage to determine the electrical thickness of the gate oxide layer. As further recognized herein, however, as the thickness of the gate oxide becomes very small, as is the trend in semiconductor manufacturing, the leakage current caused by electrons tunnelling through the oxide increases dramatically. This increases the parasitic resistance of the device and consequently makes it difficult if not impossible to accurately determine a capacitance using conventional methods, hence rendering the computation of oxide electrical thickness problematic.

The phenomenon of increased tunnelling leakage current in very thin gate oxide layers is noted in Yang et al., "MOS Capacitance Measurements for High-Leakage Thin Dielectrics", IEEE vol. 46 (July, 1999). Unfortunately, Yang et al. does not teach how to extract gate oxide electrical thickness, a shortcoming that the present invention addresses.

BRIEF SUMMARY OF THE INVENTION

A method is disclosed for determining the electrical thickness of a gate oxide layer of a MOSFET. The method includes measuring at least one measured capacitance, and using the measured capacitance, rendering a first capacitance. Then, using the first capacitance, the electrical thickness is determined.

In a specific embodiment, two measured capacitances, one each at a respective frequency, are measured for each of a plurality of gate voltages. In essence, the first capacitance is a leakage-current corrected capacitance. In a broader sense, however, the first capacitance is simply a capacitance that is derived from one or more, preferably two, measured capacitances $C_1$, $C_2$.

To render the first capacitance, a ratio of the difference between first and second frequency-dependent terms to the difference between the squares of first and second frequencies is determined. More specifically, the first capacitance $C=\{[f_1^2 C_1(1+D_1^2)]-[f_2^2 C_2(1+D_2^2)]\}/\{f_1^2-f_2^2\}$, wherein $f_1$ is the first frequency, $f_2$ is the second frequency, $D_1$ is a first dissipation associated with the first frequency, and $D_2$ is a second dissipation associated with the second frequency. The electrical thickness is an inverse function of the first capacitance.

Other features of the present invention are disclosed or apparent in the section entitled "DETAILED DESCRIPTION OF THE INVENTION".

DETAILED DESCRIPTION OF THE INVENTION

Figure 1:
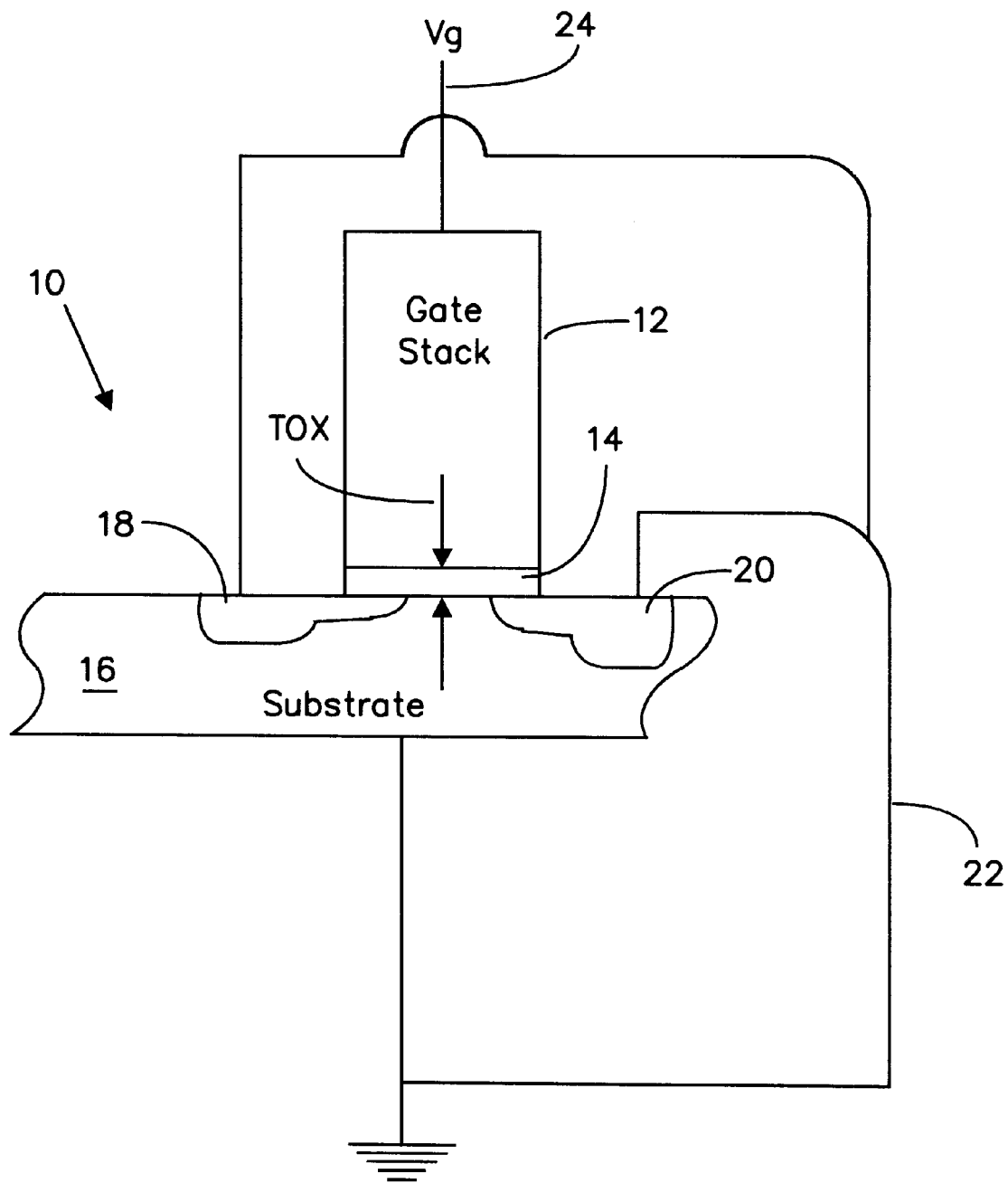
FIG. 1 is a schematic diagram of a MOSFET device with gate oxide layer and electrical measuring circuit.

Referring initially to FIG. 1, a semiconductor device 10 is shown having plural gate stacks 12 (only a single gate stack 12 shown for clarity) conventionally formed on a gate oxide layer 14, which in turn is formed on semiconductor substrate 16. The gate stack 12 can be, e.g., one thousand to fifteen hundred Angstroms (1000 Å–1500 Å) thick, and the oxide layer 14 can physically be, e.g., twelve to twenty Angstroms (12 Å–20 Å) thick, although thinner or thicker oxide layers 14 are contemplated herein. Also, the gate oxide layer 14 defines an electrical thickness $T_{ox}$.

The substrate 16 includes regions 18, 20 which establish source and drain regions of a MOSFET according to the present invention. As shown in FIG. 1, an electrically grounded line 22 connects the source and drain regions 18, 20 and the substrate 16. Also, a voltage line 24 is connected to the gate stack 14. Using the lines 22, 24, the below-described measurements of capacitance versus voltage are made, such that a leakage current-corrected capacitance can be determined for determining the electrical thickness $T_{ox}$, for very thin gate oxide layers more accurately than the conventional method, i.e., more accurately than using a non-corrected capacitance.

Figure 2:
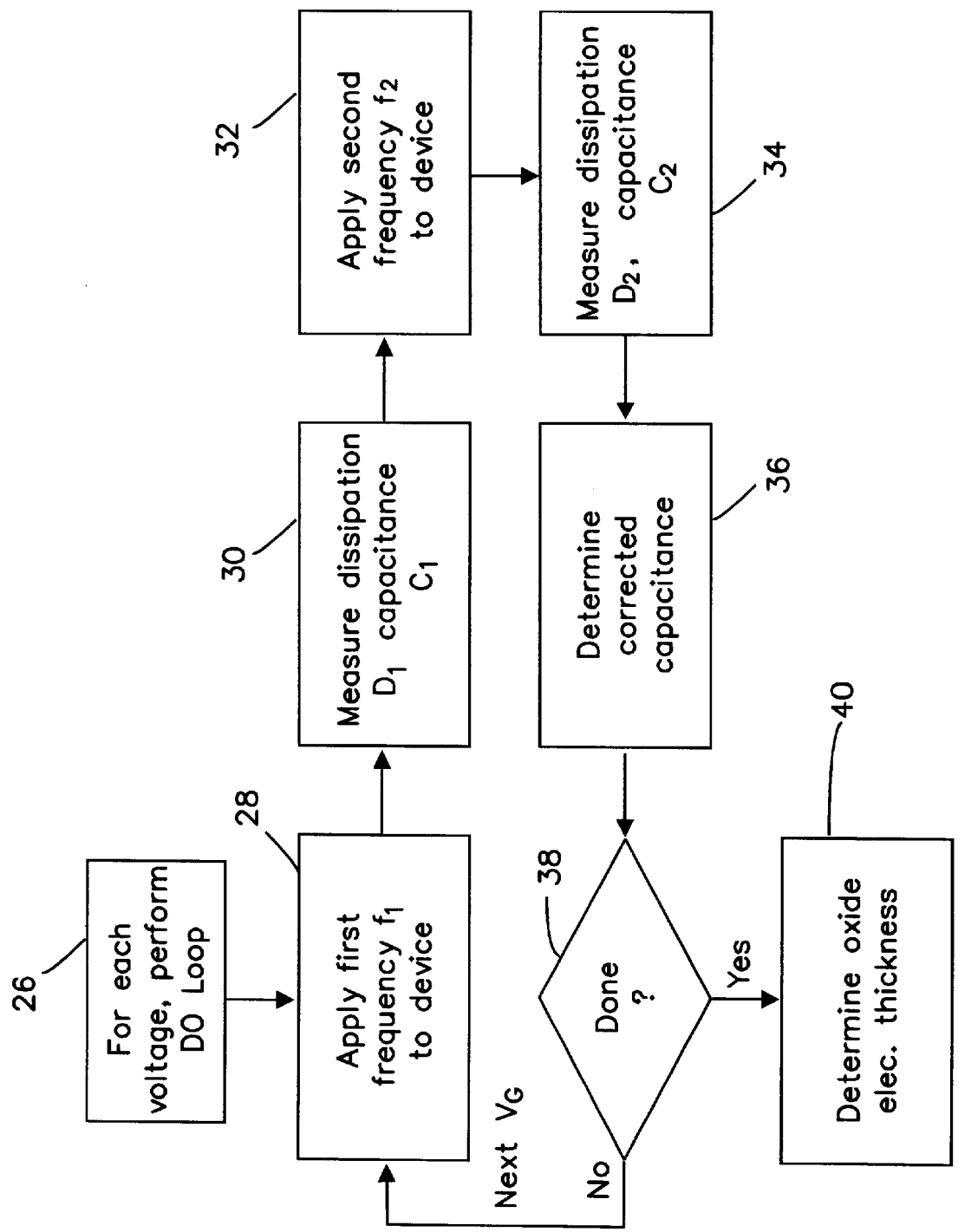
FIG. 2 is a flow chart showing the steps of the present invention for determining the electrical thickness of a gate oxide layer.

Now referring to FIG. 2 to understand the method of the present invention for accurately determining the electrical thickness $T_{ox}$ of the gate oxide layer 14, at block 26 a DO loop is entered for each of a plurality of gate voltages, applied to the voltage line 24. At block 28, a voltage at a first frequency $f_1$, is applied to the device 10. The first frequency $f_1$, can be, e.g., one hundred KiloHertz (100 KHz), although other frequencies can be used.

Moving to block 30, the device dissipation $D_1$ and capacitance $C_1$ at the first frequency are measured in accordance with dissipation and capacitance measurement techniques known in the art. Mathematically, the dissipation $D_1$ is directly proportional to the frequency $f_1$, and is inversely proportional to the capacitance $C_1$ and parallel parasitic resistance $R_1^P$ attributable to the leakage current.

It is to be understood that the model disclosed herein assumes the dominance of the parallel resistance over the series resistance in the equivalent circuit of the device 10, owing to the very thin gate oxide layers contemplated hereunder. For thicker oxides, however, the series resistance would dominate, in which case the dissipation $D_1$ would be inversely proportional to the series parasitic resistance $R_1^S$ of the equivalent circuit of the device 10.

Once the first dissipation and capacitance $D_1$, $C_1$ are determined, the process moves to block 32, wherein the voltage used at block 28 but at a second frequency $f_2$ is applied to the device 10. The second frequency $f_2$ can be, e.g., one MegaHertz (1 MHz), although other frequencies can be used. Moving to block 34, the device dissipation $D_2$ and capacitance $C_2$ at the second frequency are measured.

Once the two sets of dissipation and capacitance are measured, the logic proceeds to block 36 to determine a leakage current-corrected, frequency-independent capacitance C as follows.

$$C=\{[f_1^2 C_1(1+D_1^2)]-[f_2^2 C_2(1+D_2^2)]\}/\{f_1^2-f_2^2\}$$

After the leakage current-corrected capacitance C has been determined, the method proceeds to decision diamond 38, wherein the method determines whether any more gate voltages are to be used. If so, the method loops back to block 28 for the next gate voltage. Otherwise, the method ends at block 40 by determining the oxide layer electrical thickness $T_{ox}$. In one embodiment, the oxide layer electrical thickness $T_{ox}$ is determined by extracting the corrected capacitance from a graph of corrected capacitance versus gate voltage for the appropriate voltage, such as the graph shown in FIG. 3, and then computing the electrical thickness as follows:

$T_{ox}=\epsilon\epsilon_0 A/C$, wherein $\epsilon$=dielectric permittivity, $\epsilon_0$=permittivity of air, and A=area of the MOS cap oxide area.

Figure 3:
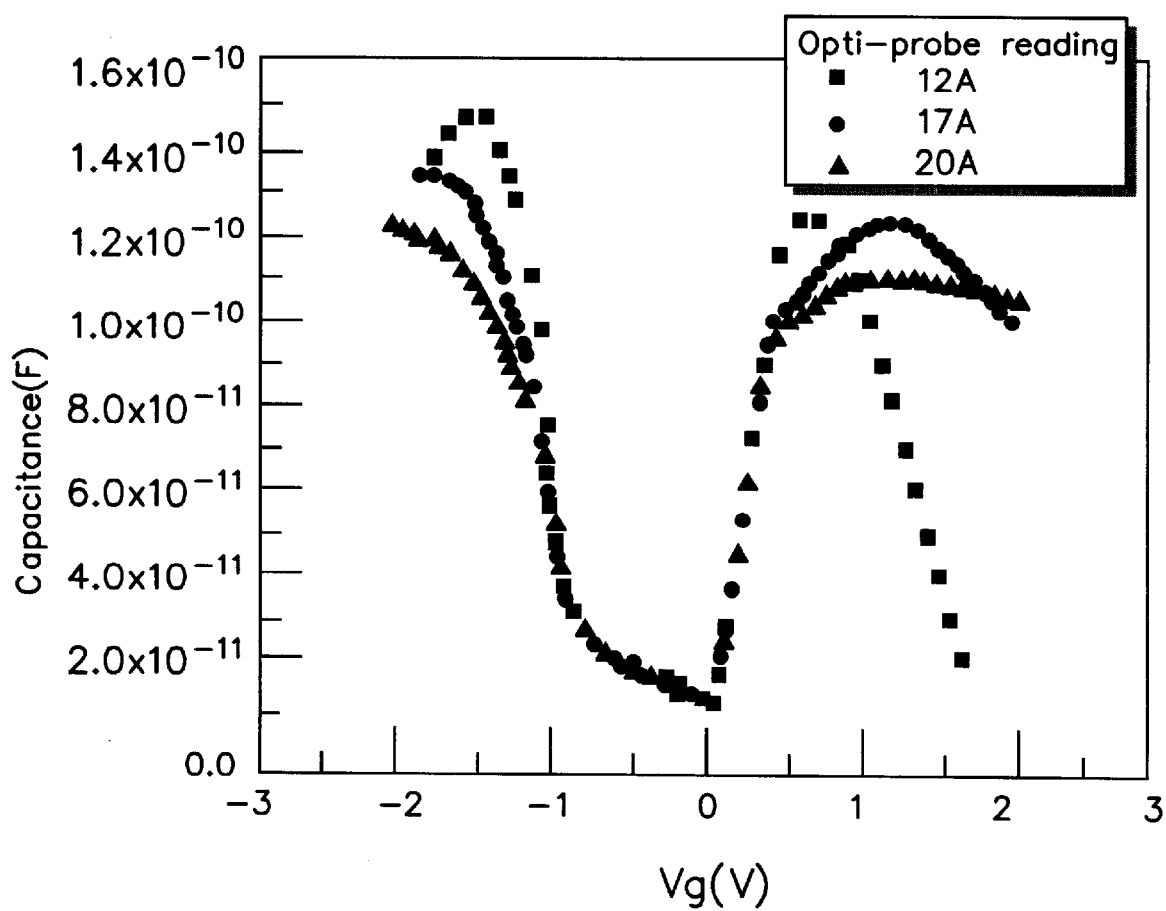
FIG. 3 is a chart showing uncorrected capacitances, illustrating the errors that can arise without the benefit of the present invention.

FIG. 3 shows a graph of measured capacitances for three oxide layers (12 Å, 17 Å, and 20 Å) that have not been corrected in accordance with present principles. As shown, at a voltage of one volt, the relatively low capacitance for the 12 Å layer erroneously indicates that the 12 Å layer is thicker than the 17 Å layer, a result that is manifestly wrong.

Figure 4:
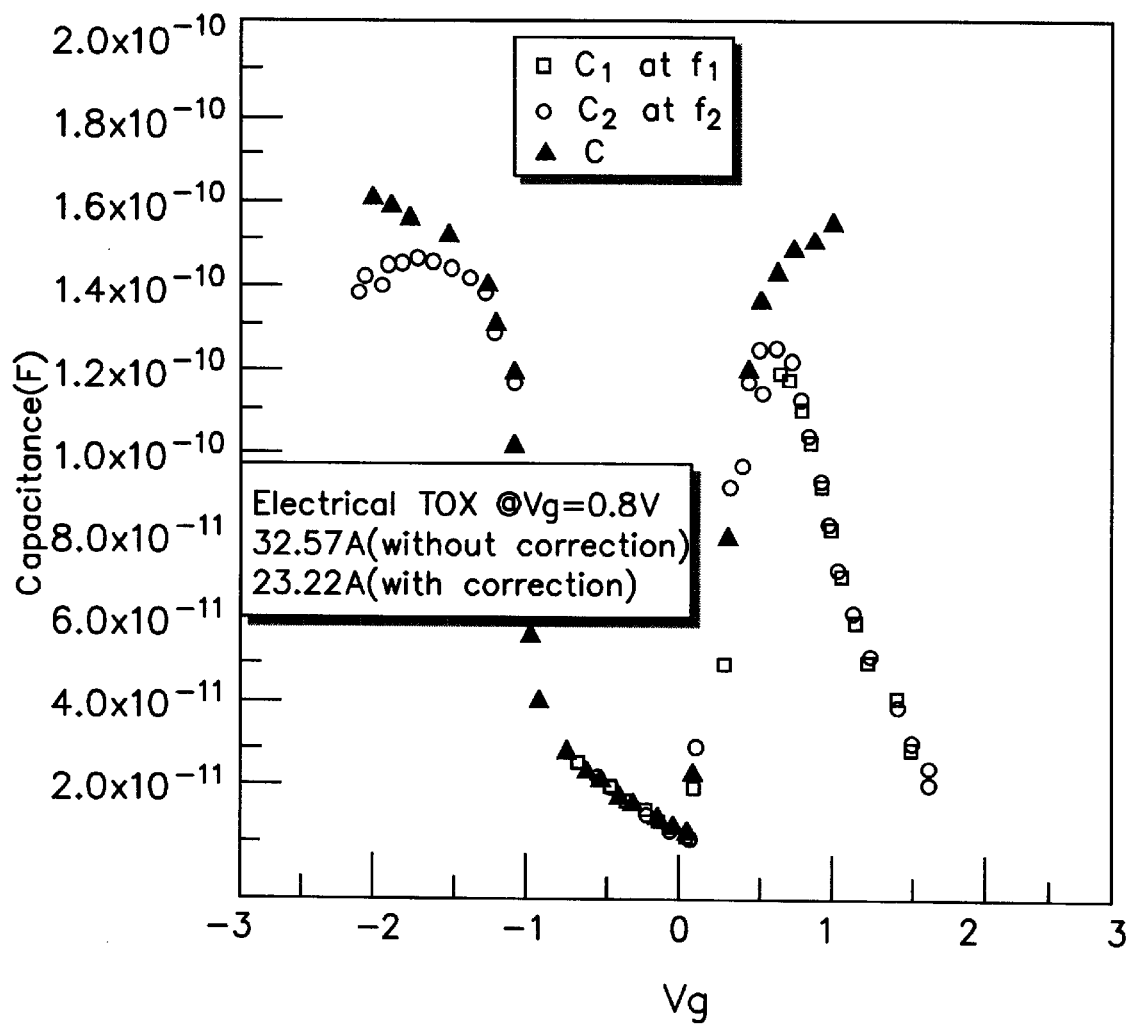
FIG. 4 is a chart showing measured capacitances and corrected capacitance as functions of gate voltage, in accordance with the present invention.

FIG. 4, on the other hand, shows measured capacitances $C_1$, $C_2$ and corrected capacitance C as functions of gate voltage. As shown in FIG. 4 and as indicated for convenience in the comment window, the corrected capacitance at a gate voltage of 0.8 volts for a gate oxide layer that has a physical thickness of 12 Å in an actually tested device produces a computed electrical thickness of 23.22 Å. Contrast this to the conventionally-determined electrical thickness (at the same gate voltage) of 32.57 Å. Clearly, the corrected capacitance of the present invention produces a much more accurate oxide electrical thickness than does the conventionally determined capacitance.

While the particular METHOD FOR DETERMINING TRANSISTOR GATE OXIDE THICKNESS as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A method for determining the electrical thickness of a gate oxide layer of a MOSFET, comprising:

measuring at least a capacitance;

using the measured capacitance to render a first capacitance; and using the first capacitance to determine the electrical thickness, wherein the act of measuring includes measuring at least first and second frequency-dependent measured capacitances $C_1$, $C_2$.

2. The method of claim 1, wherein the act of using the measured capacitance to render the first capacitance is undertaken by determining a ratio of the difference between first and second frequency-dependent capacitance terms to the difference between the squares of first and second frequencies.

3. The method of claim 2, wherein the first capacitance C is set equal to $\{[f_1^2 C_1(1+D_1^2)]-[f_2^2 C_2(1+D_2^2)]\}/\{f_1^2-f_2^2\}$, wherein $f_1$ is the first frequency, $f_2$ is the second frequency, $D_1$ is a first dissipation associated with the first frequency, and $D_2$ is a second dissipation associated with the second frequency.

4. The method of claim 3, wherein the act of using the first capacitance to determine the electrical thickness includes determining the electrical thickness to be an inverse function of the first capacitance.

5. A method for determining the electrical thickness of a gate oxide layer of a MOSFET, comprising:

measuring at least a capacitance;

using the measured capacitance to render a first capacitance; and using the first capacitance to determine the electrical thickness, wherein the act of using the first capacitance to determine the electrical thickness includes determining the electrical thickness to be an inverse function of the first capacitance.

6. A method for determining the electrical thickness of a gate oxide layer of a MOSFET, comprising:

measuring at least a capacitance;

using the measured capacitance to render a first capacitance; and using the first capacitance to determine the electrical thickness, wherein the first capacitance is a leakage current-corrected capacitance.

\* \* \* \* \*